United States Patent [19]

Shiotani

[11] 4,147,963
[45] Apr. 3, 1979

[54] VERTICAL DEFLECTION SYSTEM FOR A TELEVISION RECEIVER

[75] Inventor: Tomokazu Shiotani, Ibaraki, Japan

[73] Assignee: Matsushita Electric Industrial Co., Ltd., Osaka, Japan

[21] Appl. No.: 822,643

[22] Filed: Aug. 8, 1977

[30] Foreign Application Priority Data

Aug. 20, 1976 [JP] Japan .................................. 51-99921
Aug. 20, 1976 [JP] Japan .................................. 51-99922
Aug. 23, 1976 [JP] Japan .................................. 51-100870
Sep. 2, 1976 [JP] Japan ............................ 51-118572[U]
Dec. 20, 1976 [JP] Japan ............................ 51-171630[U]

[51] Int. Cl.² ........................................... H01J 29/70
[52] U.S. Cl. ..................................... 315/387; 315/403
[58] Field of Search ................................ 315/387, 403

[56] References Cited

U.S. PATENT DOCUMENTS 3,496,407  2/1970  Entenmann ....................... 315/387 X

FOREIGN PATENT DOCUMENTS 1220687  1/1971  United Kingdom ..................... 315/387

Primary Examiner—Maynard R. Wilbur
Assistant Examiner—Richard E. Berger
Attorney, Agent, or Firm—Stevens, Davis, Miller & Mosher

[57] ABSTRACT

A vertical deflection system for a television receiver produces a sawtooth wave signal of a high linearity by high speed charge (or discharge) of a capacitor and a low speed discharge (or charge) thereof at a constant current rate, compares a deflection current flowing in a vertical deflection coil with the sawtooth wave signal in a differential amplifier to correct the deflection current whereby the amplitude and linearity of the vertical deflection are automatically corrected. The amplitude of the vertical deflection can be adjusted without affecting other characteristics.

10 Claims, 7 Drawing Figures

VERTICAL DEFLECTION SYSTEM FOR A TELEVISION RECEIVER

The present invention relates to a vertical deflection system for a television receiver or the like.

Figure 1:
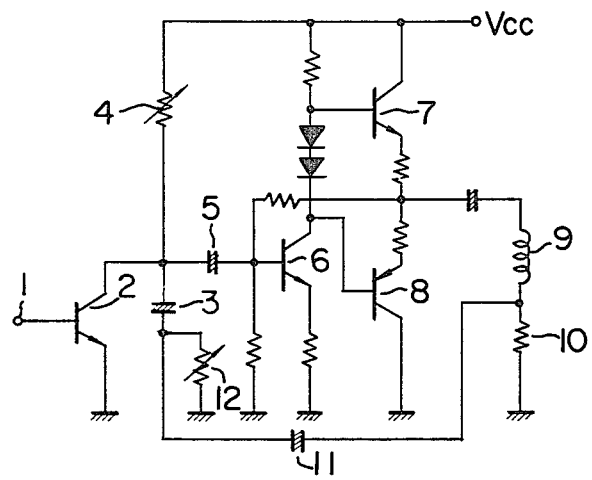
FIG. 1 is a circuit diagram of a prior art vertical deflection system.

The vertical deflection system shown in FIG. 1 is disclosed in the Japanese Laid-Open (before Examination) Patent Application No. 46-5403 and has been widely used. It is a Miller integration type vertical deflection circuit. In this circuit, when a vertical synchronized positive pulse is applied to an input terminal 1 from a vertical oscillator, a transistor 2 is turned on to discharge a capacitor 3, which is generally charged from a power supply through a resistor 4 during a period other than the on time of the transistor 2. In this manner, a sawtooth wave voltage is produced, an amplitude of which is changed by changing the resistance of the resistor 4. The resulting sawtooth wave voltage is applied through a capacitor 5 to an output circuit comprising transistors 6, 7 and 8, which supplies a sawtooth wave current to a vertical deflection yoke 9. A voltage waveform of the deflection current is produced across a resistor 10 connected in series with the vertical deflection yoke 9. This voltage is differentiated by a capacitor 11 and a resistor 12 and the differentiated waveform is fed back to the sawtooth wave generating capacitor 3 to correct the linearity. Through such a loop, a Miller integration circuit is formed.

In the circuit arrangement described above, the resistor 4 is variable to change a charging current to the capacitor 3 for adjusting the amplitude of an image. However, since the impedance of the charging current source varies with the resistor 4, the waveform of the sawtooth wave voltage appearing at the junction of the capacitors 3 and 5 is not constant. In this circuit configuration, the linearity of the image also changes with the adjustment of the amplitude. Thus, when the image adjustment is performed in a factory, the amplitude adjustment and the linearity adjustment are alternately carried out to attain a highly linear, constant amplitude image. However, this requires a very inefficient operation step.

In an apparatus which includes a cathode ray tube, such as the television receiver or the like, both D.C. and A.C. feedbacks are necessary to improve the linearity of scan in the vertical deflection system for raster scan. In the prior art apparatus, those feedbacks were separately provided. This results in a complex circuit and an increase in the number of pins required because the terminals for two different feedbacks must be separately provided. As a result, the circuit is not suitable for formation as an integrated circuit structure.

Figure 2:
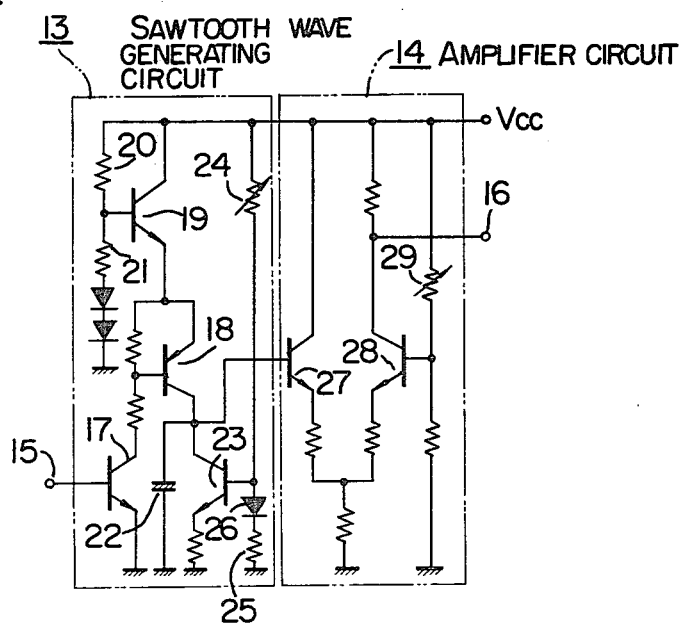
FIG. 2 is a circuit diagram of a basic sawtooth wave signal generator of a vertical deflection system.

A circuit as shown in FIG. 2 has been proposed as a sawtooth wave signal generating circuit for generating a highly linear sawtooth wave signal for use in vertical deflection. In FIG. 2, numeral 13 denotes a sawtooth wave generating circuit, and 14 an amplifier circuit which receives a positive input pulse at an input terminal 15 and produces a sawtooth wave voltage at an output terminal 16.

In this apparatus, when a positive input pulse is applied to the input terminal 15, a switching circuit comprising transistors 17 and 18 is turned on and charges a capacitor 22 connected in series thereto at a high rate from a power supply having a voltage substantially equal to a voltage divided by resistors 20 and 21 and applied through a temperature compensating transistor 19. A circuit comprising a transistor 23, resistors 24 and 25 and a diode 26, connected in parallel with the capacitor 22 is a constant current circuit, which gradually discharges the capacitor 22 at a constant current rate. The sawtooth wave voltage is produced across the capacitor 22 by the combination of the high speed charging and the constant rate discharging. The resultant output is amplified by an amplifier circuit 14 comprising transistors 27 and 28, which produces an output at an output terminal 16.

Figure 3:
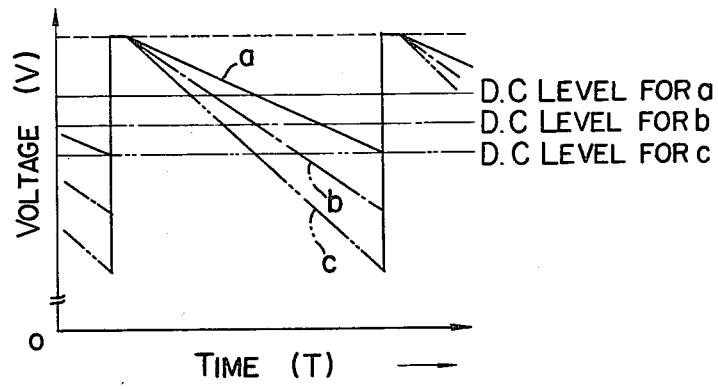
FIG. 3 shows waveforms for illustrating characteristics of the system of FIG. 2.

In the above circuit, however, when the magnitude of an amplitude adjusting resistor 24 is changed to change the amplitude of the sawtooth wave voltage, the amplitude of the sawtooth wave voltage changes as the magnitude of the current flowing in the transistor 23 changes but a D.C. level of the sawtooth wave voltage also changes. This is illustrated in FIG. 3, in which a, b and c represent the sawtooth wave voltages and the D.C. levels when the magnitude of the resistor 24 is high, medium and low, respectively. As a result, the sawtooth wave voltage is applied to the transistor 27 of the amplifier circuit 14 while a bias adjusting resistor 29 is connected to a base of the other transistor 28, which resistor must be adjusted each time the amplitude is adjusted such that the D.C. level of the sawtooth wave voltage output is maintained at a constant level. Such adjustment is troublesome and difficult to attain.

It is an object of the present invention to provide a vertical deflection system which has resolved the drawbacks encountered in the prior art system.

It is a specific object of the present invention to provide a vertical deflection system which allows the correction of the linearity of the vertical deflection without additional adjustment.

It is another object of the present invention to provide a vertical deflection system in which the vertical amplitude can be easily adjusted without affecting the linearity.

It is a further object of the present invention to provide a vertical deflection system which requires a simple circuit for correcting the linearity and which is suitable for implementation as an integrated circuit structure.

Figure 4:
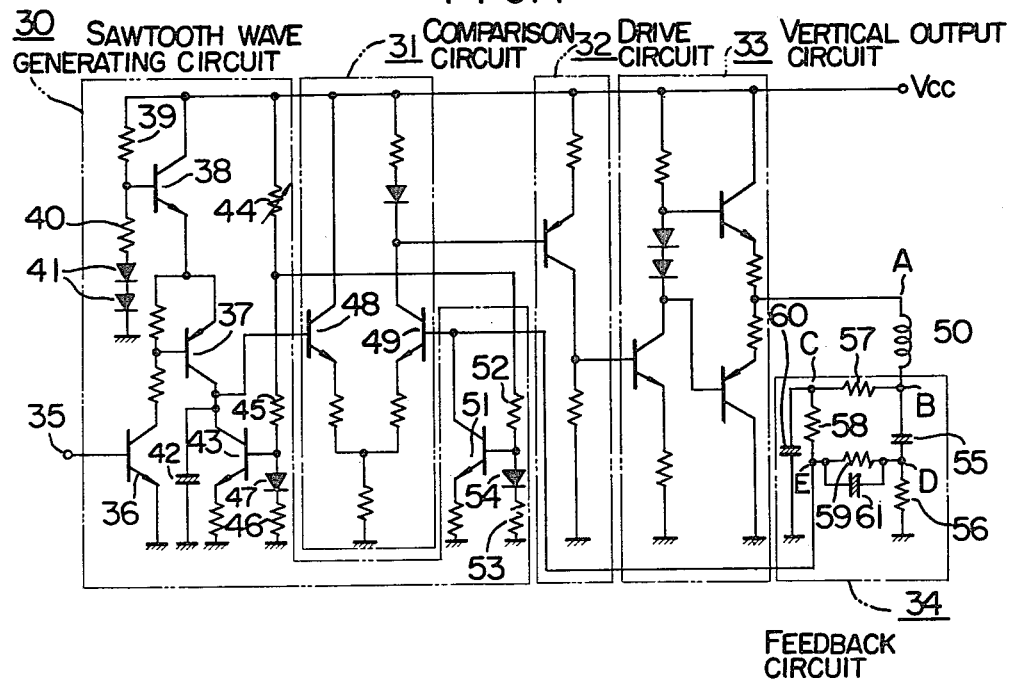
FIGS. 4, 5 and 7 show circuit diagrams of embodiments of the vertical deflection system of the present invention.
Figure 5:
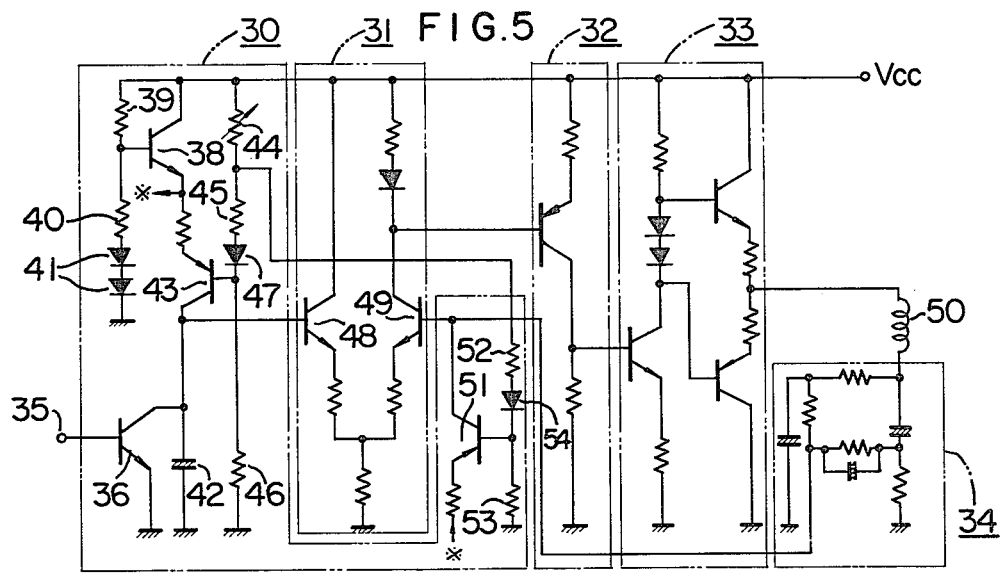
Figure 7:
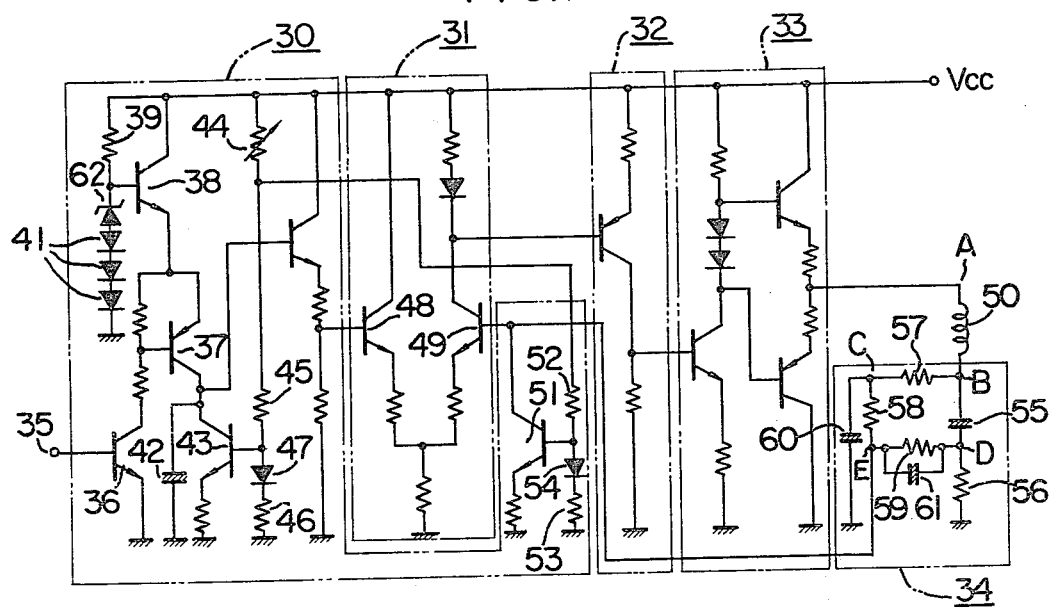

Other objects, features and advantages of the present invention will be apparent from the detailed description of the preferred embodiments when taken in conjunction with the accompanying drawings, in which:

Referring to FIGS. 4, 5 and 7 which show the preferred embodiments of the present invention, numeral 30 denotes a sawtooth wave generating circuit, 31 denotes a comparison circuit, 32 a drive circuit, 33 an OTL (Output Transformer Lens) type vertical output circuit using a SEPP (Single Ended Push-Pull) circuit, and 34 a feedback circuit, all of which are directly coupled through D.C. coupling. When a positive pulse of vertical period which is phase locked for synchronization is applied to an input terminal 35, the switching transistors 36 and 37 are turned on during the duration of the pulse so that a voltage which is approximately equal to a power supply voltage Vcc supplied through a transistor 38 divided by resistors 39 and 40 and a diode 41 is applied to a series capacitor 42, which is then charged at a high rate. On the other hand, the charge stored in the capacitor 42 is gradually discharged at a low speed at a constant current rate by a constant current circuit comprising a transistor 43 connected in parallel with the capacitor 42, resistors 44, 45 and 46 and a diode 47, to produce a sawtooth wave voltage.

The resultant sawtooth wave voltage is applied to a base of a transistor 48 which forms a first input to a comparison circuit 31 consisting of a differential amplifier comprising transistors 48 and 49. Both D.C. and A.C. somponents of a voltage waveform of a deflection current flowing in a vertical deflection coil 50 are fed back through the feedback circuit 34 as a second input to the comparison circuit 31. This second input is applied to a base of the transistor 49 to correct vertical position and the linearity.

An output of the comparison circuit 31 is amplified by the drive circuit 32 and the output circuit 33 to supply a highly linear sawtooth wave deflection current to a vertical deflection coil 50.

In the circuit described above, the amplitude adjustment of an image is effected by varying the resistance of a resistor 44 which defines the magnitude of the current flowing in the constant current circuit transistor 43 for discharging the capacitor 42. In this circuit configuration, since the current source impedance of the discharging circuit for the capacitor 42 can be very high and the impedance is not varied with the change of the current magnitude, the linearity of the image is always maintained even when the image amplitude is adjusted by the resistor 44 and no additional adjustment is required.

In this circuit arrangement, a transistor 51, resistors 52 and 53 and a diode 54 which constitute a constant current circuit similar to that constituted by the transistor 43 is connected to a base of the transistor 49 to which a feedback signal in the compare circuit 31 is applied, and a base biasing circuit for the constant current circuit is connected to a resistor 44 so that the current magnitude in the transistor 51 is changed simultaneously with the adjustment of the current magnitude of the transistor 43 by the resistor 44. In this manner, the shift of the D.C. current ratio for the transistors 48 and 49 at the time of the amplitude adjustment by the resistor 44 is prevented and the D.C. level of the output can be maintained at a constant level.

In the above embodiment, the transistors 36 and 37 are turned on when the input pulse is applied to rapidly charge the capacitor 42, which in turn is discharged through the transistor 43 at a constant current rate during a period other than pulse period. This relation may be inverted. For example, as shown in FIG. 5, the switching transistor 36 is connected in parallel with the capacitor 42 and the constant current circuit transistor 43 is connected in series with the capacitor 42 so that the transistor 36 is rendered conductive when the input pulse is applied to rapidly discharge the capacitor 42, which in turn is gradually charged through the transistor 43 at a constant current rate during a period other than a pulse period.

It should be understood that any switching circuit including FETs and relays instead of the switching transistors 36 and 37 may be used. In this manner, the present invention provides a vertical deflection system which enables the adjustment of vertical amplitude without affecting the vertical linearity and facilitates the adjustment.

The feedback circuit for correcting the vertical position and the linearity is now explained. One end of the vertical deflection coil 50 is connected to the OTL type vertical output circuit 33 while the other end is grounded via a series circuit of a first coupling capacitor 55 and a first resistor 56. Second, third and fourth resistors 57, 58 and 59 are connected in parallel with the first capacitor 55 with the second resistor 57 being connected to the vertical deflection coil 50. The junction of the second and third resistors 57, 58 is grounded via a second integrating capacitor 60, and a third A.C. coupling capacitor 61 is connected in parallel with the fourth resistor 59. A feedback signal is taken from the junction of the third and fourth resistor 58 and 59 and fed back to a base of the transistor 49 of the vertical amplifier circuit 31.

Figure 6:
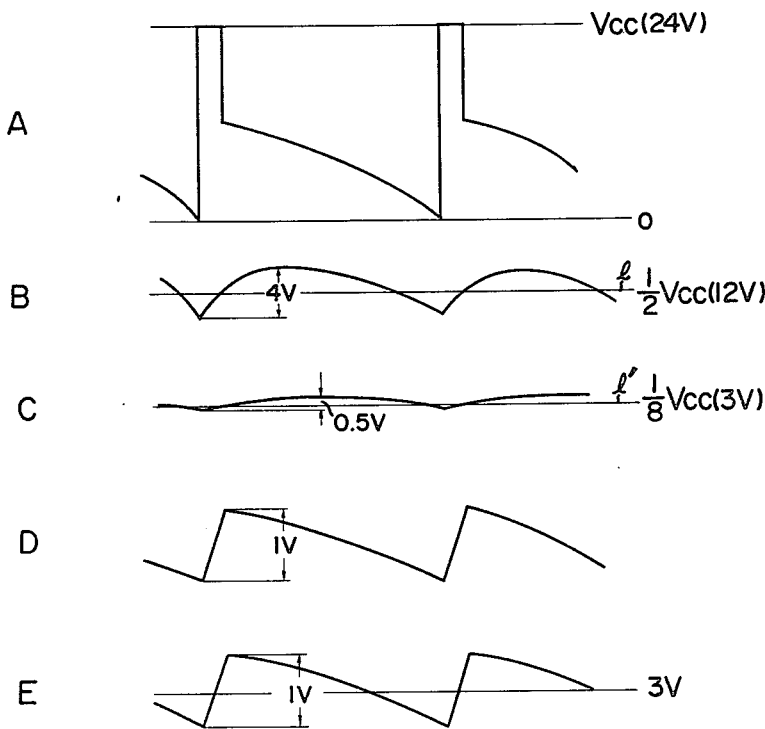
FIG. 6 shows waveforms for the system shown in FIG. 4.

In the arrangement described above, a vertical deflection current flows in the vertical deflection coil 50 during the operation so that a voltage waveform including a retrace pulse and a sawtooth wave voltage as shown in FIG. 6A is produced at a point A.

On the other hand, this deflection current causes a voltage shown in FIG. 6B at the junction of the vertical deflection coil 50 and the first capacitor 55, that is, at the point B. Since the voltage developed at this time corresponds to the integration of the vertical deflection current by the first capacitor 55 and the first resistor 56, it is close to a parabolic waveform as shown and a mean level l thereof is approximately one half of the power supply voltage Vcc and it changes with a mean level (D.C. level) of the vertical deflection current. For example, when the mean level (D.C. level) of the vertical deflection current rises by the temperature change, the mean level l of the voltage at the point B also rises. Thus, the mean level (D.C. level) of the vertical deflection current can be detected at the point B.

The voltage at the point B is then further integrated by the resistor 57 and the capacitor 58 to produce a voltage as shown in FIG. 6C at the junction of the second and third resistors 57, 58, that is, the point C, which has a waveform closer to a parabolic waveform and an appropriate amplitude at the parabolic portion. The voltage C is then divided at an appropriate dividing ratio by the third, fourth and first resistors 58, 59 and 56 and the divided voltage is fed back to the vertical amplifier circuit 31 to compensate for the variation of the mean level (D.C. level) of the vertical deflection current. Since the resistance of the first resistor 56 is sufficiently small compared with the resistances of the second, third and fourth resistors 57, 58 and 59, the first resistor 56 can be neglected in the division of the voltage.

Furthermore, since the detected voltage at the point C includes the parabolic component as shown in FIG. 6C, an S-distortion can be corrected by the feedback of the parabolic waveform voltage.

On the other hand, a sawtooth waveform voltage corresponding to an A.C. component of the vertical deflection current as shown in FIG. 6D appears at the junction of the first capacitor 55 and the first resistor 56, that is, at the point D. When the amplitude of the vertical deflection current is changed by a temperature change or the like in the amplifier circuit, the amplitude of the sawtooth wave voltage also changes accordingly, and when the waveform of the vertical deflection current distorts the amplitude of the sawtooth wave voltage also changes accordingly. In this manner, the A.C. component of the vertical deflection current can be detected at the point D.

By feeding back the detected voltage D of the A.C. component to the vertical amplifier circuit 31 through the coupling capacitor 61, the waveform distortion of the vertical deflection current can be compensated for and a highly linear vertical deflection is attained.

In this system, at the junction of the third and fourth resistors 58 and 59, that is, at the point E, the detected mean level (D.C. level) of the vertical deflection current is combined with the detected A.C. component to produce a combined feedback voltage as shown in FIG. 6E, which is then fed back to the vertical amplifier circuit 31 as a combined feedback voltage. Thus, only a single terminal for feedback need be provided at the base of the transistor 49 and the total number of parts can be reduced. This is very effective in implementing the system in an integrated circuit structure.

In such a feedback circuit, it is necessary to reduce the resistance of the first resistor 56 in order to reduce power loss in the vertical deflection. When the fourth resistor 59 is connected between the point E and the ground as the signal combining means as is commonly expected, the A.C. component is further divided by the second, third and fourth resistors 57, 58 and 59 and a high loop gain for the feedback loop is not attained. As a result, a satisfactory compensation is not attained or the resistance of the first resistor 56 is increased at the sacrifice of the deflection power loss.

On the other hand, according to the present invention, since one end of the fourth resistor 59 is connected to the junction of the first capacitor 55 and the first resistor 56 or to the point D, the A.C. component is not divided and the resistance of the first resistor 56 can be reduced to reduce the power loss while maintaining a high loop gain for the feedback loop to attain a satisfactory compensation. Accordingly, a very effective apparatus can be provided.

Specific values for the capacitors and the resistors are given below by way of example: first capacitor 55—2200 $\mu$F; second capacitor 60—0.47 $\mu$F; third capacitor 61—10 $\mu$F; first resistor 56—1 $\Omega$; second resistor 57—3.3 K$\Omega$; third resistor 58—6.8 K$\Omega$; fourth resistor 59—2.7 K$\Omega$.

As described above, the variation in the mean level (D.C. level) of the vertical deflection current can be compensated for together with the variation in the A.C. component, and a high loop gain for the feedback loop is attained which achieves a good compensation control characteristic. Furthermore, the circuit configuration can be simplified and only the single terminal for the feedback circuit is required. Accordingly, an excellent vertical deflection system which is adopted for implementation as an integrated circuit structure is provided.

FIG. 7 shows another embodiment in which the operation of the vertical deflection system is further stabilized. In this embodiment, a Zener diode 62 is connected in series with a temperature compensating diode between the base of the temperature compensating transistor 38 and the ground. With this arrangement, the voltage applied to the capacitor 42 is stabilized even when the power supply voltage varies so that the amplitude does not change with a change in the power supply voltage.

What is claimed is:

1. A vertical deflection system for a television receiver comprising;
    a sawtooth wave generating circuit for generating a highly linear sawtooth wave signal having a vertical deflection period;
    a comparison circuit including a differential amplifier connected to an output of said sawtooth wave generating circuit, said sawtooth wave signal being applied to one input of said comparison circuit;
    an amplifier circuit connected to an output of said comparison circuit for amplifying an output signal of said comparison circuit for application to a vertical deflection coil to cause a vertical deflection current to flow therethrough; and
    a feedback circuit connected in series with said vertical deflection coil for applying both a D.C. component and an A.C. component of said vertical deflection current to the other input terminal of said differential amplifier of said comparison circuit.

2. A vertical deflection system according to claim 1 wherein said sawtooth wave generating circuit includes:
    a charge/discharge capacitor;
    a switching circuit connected in series with said capacitor, said switching circuit being switched by input pulses of the vertical period to rapidly charge said capacitor; and
    a constant current circuit connected in parallel with said capacitor for gradually discharging said capacitor at a constant current rate.

3. A vertical deflection system according to claim 2 wherein a temperature compensating transistor is connected between said switching circuit and a power supply, and a diode is connected to a base of said transistor.

4. A vertical deflection system according to claim 2 wherein a temperature compensating transistor is connected between said switching circuit and a power supply, and a series circuit of a temperature compensating diode and a Zener diode is connected to a base of said transistor.

5. A vertical deflection system according to claim 2 wherein a constant current circuit similar to said constant current circuit connected in parallel with said capacitor is connected to the other input terminal of said differential amplifier of said comparison circuit and an adjusting means is provided to simultaneously change the current magnitudes of both of said constant current circuits to adjust the amplitude of the vertical deflection.

6. A vertical deflection system according to claim 1 wherein said feedback circuit includes;
    a first capacitor and a first resistor connected in series between said vertical deflection coil and ground;
    a series circuit of second, third and fourth resistors connected in parallel with said first capacitor, said second resistor being connected to said vertical deflection coil;
    a second capacitor connected between the junction of said second and third resistors and ground; and
    a third capacitor connected in parallel with said fourth resistor;
    the junction of said third and fourth resistors being connected to said other input terminal of said differential amplifier of said comparison circuit.

7. A vertical deflection system according to claim 1 wherein said sawtooth wave generating circuit includes;

a charge/discharge capacitor;

a switching circuit connected in parallel with said capacitor, said switching circuit being switched by input pulses of the vertical period to rapidly discharge said capacitor; and a constant current circuit connected in series with said capacitor for gradually charging said capacitor at a constant current rate.

8. A vertical deflection system according to claim 7 wherein a temperature compensating transistor is connected between said constant current circuit and a power supply, and a diode is connected to a base of said transistor.

9. A vertical deflection system according to claim 7 wherein a temperature compensating transistor is connected between said constant current circuit and a power supply, and a series circuit of a temperature compensating diode and a Zener diode is connected to a base of said transistor.

10. A vertical deflection system according to claim 7 wherein a constant current circuit similar to said constant current circuit connected in series with said capacitor is connected to the other input terminal of said differential amplifier of said comparison circuit and an adjusting means is provided to simultaneously change the current magnitudes of both of said constant current circuits to adjust the amplitude of the vertical deflection.

* * * * *